USOO8492278B2

(12) United States Patent
Good et al.

(10) Patent No.: US 8,492,278 B2
(45) Date of Patent: Jul. 23, 2013

(54) METHOD OF FORMING A PLURALITY OF SPACED FEATURES

(75) Inventors: Farrell Good, Meridian, ID (US); Baosuo Zhou, Boise, ID (US); Xiaolong Fang, Boise, ID (US); Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 278 days.

(21) Appl. No.: 12/749,923

(22) Filed: Mar. 30, 2010

(65) Prior Publication Data

US 2011/0244674 A1 Oct. 6, 2011

(51) Int. Cl.
*H01L 21/311* (2006.01)
(52) U.S. Cl.
USPC ............ 438/694; 257/E21.017; 257/E21.249; 257/E21.252; 257/E21.305; 257/E21.582; 257/E21.595; 438/201; 438/211; 438/216; 438/257; 438/287; 438/594; 438/669; 438/689; 438/706
(58) Field of Classification Search
USPC .................. 257/E21.017, E21.249, E21.252, 257/E21.305, E21.582, E21.595; 438/216, 438/257, 287, 594, 669, 689, 694, 706
See application file for complete search history.

(56) References Cited

U.S. PATENT DOCUMENTS

| | | | |
|---|---|---|---|
| 5,500,312 A | 3/1996 | Harriott et al. | |
| 6,345,399 B1 | 2/2002 | Jamison et al. | |
| 6,653,735 B1 | 11/2003 | Yang et al. | |
| 7,271,045 B2 | 9/2007 | Prince et al. | |
| 7,547,640 B2 | 6/2009 | Abatchev et al. | |
| 7,598,174 B1 | 10/2009 | Zhuang | |
| 7,732,335 B2 * | 6/2010 | Lee et al. | 438/700 |
| 2005/0141085 A1 | 6/2005 | Shimizu et al. | |
| 2005/0260819 A1 * | 11/2005 | Belyansky et al. | 438/305 |
| 2007/0148984 A1 | 6/2007 | Abatchev et al. | |
| 2008/0157403 A1 | 7/2008 | Lee et al. | |
| 2008/0160765 A1 | 7/2008 | Lee et al. | |
| 2009/0035665 A1 | 2/2009 | Tran | |
| 2011/0155692 A1 * | 6/2011 | Yau | 216/41 |

FOREIGN PATENT DOCUMENTS

WO WO US2011/028450 11/2011
WO WO US2011/028450 10/2012

OTHER PUBLICATIONS

Sun et al., "The origin of internal stress in low-voltage sputtered tungsten films", Journal of Applied Physics, vol. 46. No. 1, Jan. 1975, pp. 112-117.
Windischmann, "An intrinsic stress scaling law for polycrystalline thin films prepared by ion beam sputtering", J. Appl. Phys. 62 (5), Sep. 1, 1987, pp. 1800-1807.

* cited by examiner

*Primary Examiner* — Asok K Sarkar
(74) *Attorney, Agent, or Firm* — Wells St. John P.S.

(57) ABSTRACT

A method of forming a plurality of spaced features includes forming sacrificial hardmask material over underlying material. The sacrificial hardmask material has at least two layers of different composition. Portions of the sacrificial hardmask material are removed to form a mask over the underlying material. Individual features of the mask have at least two layers of different composition, with one of the layers of each of the individual features having a tensile intrinsic stress of at least 400.0 MPa. The individual features have a total tensile intrinsic stress greater than 0.0 MPa. The mask is used while etching into the underlying material to form a plurality of spaced features comprising the underlying material. Other implementations are disclosed.

28 Claims, 10 Drawing Sheets

METHOD OF FORMING A PLURALITY OF SPACED FEATURES

TECHNICAL FIELD

Embodiments disclosed herein pertain to methods of forming a plurality of spaced features, for example in the fabrication of integrated circuitry.

BACKGROUND

In the fabrication of integrated circuitry, masks may be used when etching into underlying material to form desired feature shapes. Photolithographic processing is one technique used in fabrication of such masks. For example, photoresist may be deposited over a substrate and exposed to patterned radiation followed by developing to form a patterned photoresist mask. The pattern of the photoresist mask may be subsequently transferred to form electronic device components into underlying substrate material that is one or more of electrically conductive, insulative, or semiconductive. In many applications, the photoresist material of the mask is insufficiently robust by itself to serve as a mask while completing etching of the device features. Hardmask material may be used in such instances between the photoresist and the material into which the device features are formed. Accordingly, the photoresist mask pattern is transferred into the hardmask material which is then used as a more robust etching mask than photoresist. In such instances, the photoresist is likely completely removed during etch of the hardmask material or during etch of the material beneath the hardmask material.

Integrated circuitry fabrication continues to make ever smaller feature width dimensions to minimize the size of individual device components and thereby increase density of the components within an integrated circuit. One common component in integrated circuits is an electrically conductive line, for example global or local interconnect lines. Other example conductive lines include transistor gate lines that may or may not incorporate charge storage regions which are spaced along individual transistor gate lines. When etching conductive material beneath a hardmask to form conductive lines, it is desirable that the line material have sidewalls which correspond to the longitudinal orientation of the sidewalls of the patterned hardmask material. However, as minimum line widths approached 30 nanometers, the etching may have a tendency to form the line sidewalls that serpentine in a wavelike manner along the longitudinal orientation of the lines. This may not be desirable.

For example referring to FIG. 1, a top view of a portion of a prior art substrate 10 is shown. Such includes plurality of line constructions 14 which have been patterned over underlying substrate material 12. Line constructions 14 were formed using pitch multiplication techniques wherein minimum width of individual of the lines was about 25 nanometers, and space between immediately adjacent of the lines was about 30 nanometers. A sacrificial hardmask material (not shown) comprising a compressive amorphous carbon layer received over a compressive undoped silicon dioxide layer was used as spaced line features of a mask. Such resulted in the depicted undesired line waviness of the sidewalls along the longitudinal orientation of the lines.

While the invention was motivated in addressing the above-identified issues, the invention is in no way so limited. Rather, the invention is limited by the accompanying claims as appropriately interpreted in accordance with the doctrine of equivalence.

DETAILED DESCRIPTION OF EXAMPLE EMBODIMENTS

Embodiments of the invention include methods of forming a plurality of spaced features, for example forming a plurality of spaced electrically conductive lines. Other features may be additionally and/or alternately formed. In some embodiments, the conductive lines which are formed have respective minimum line widths of no greater than 30 nanometers, for example in addressing and reducing line waviness of such narrow lines as identified above in the Background section.

Figure 1:
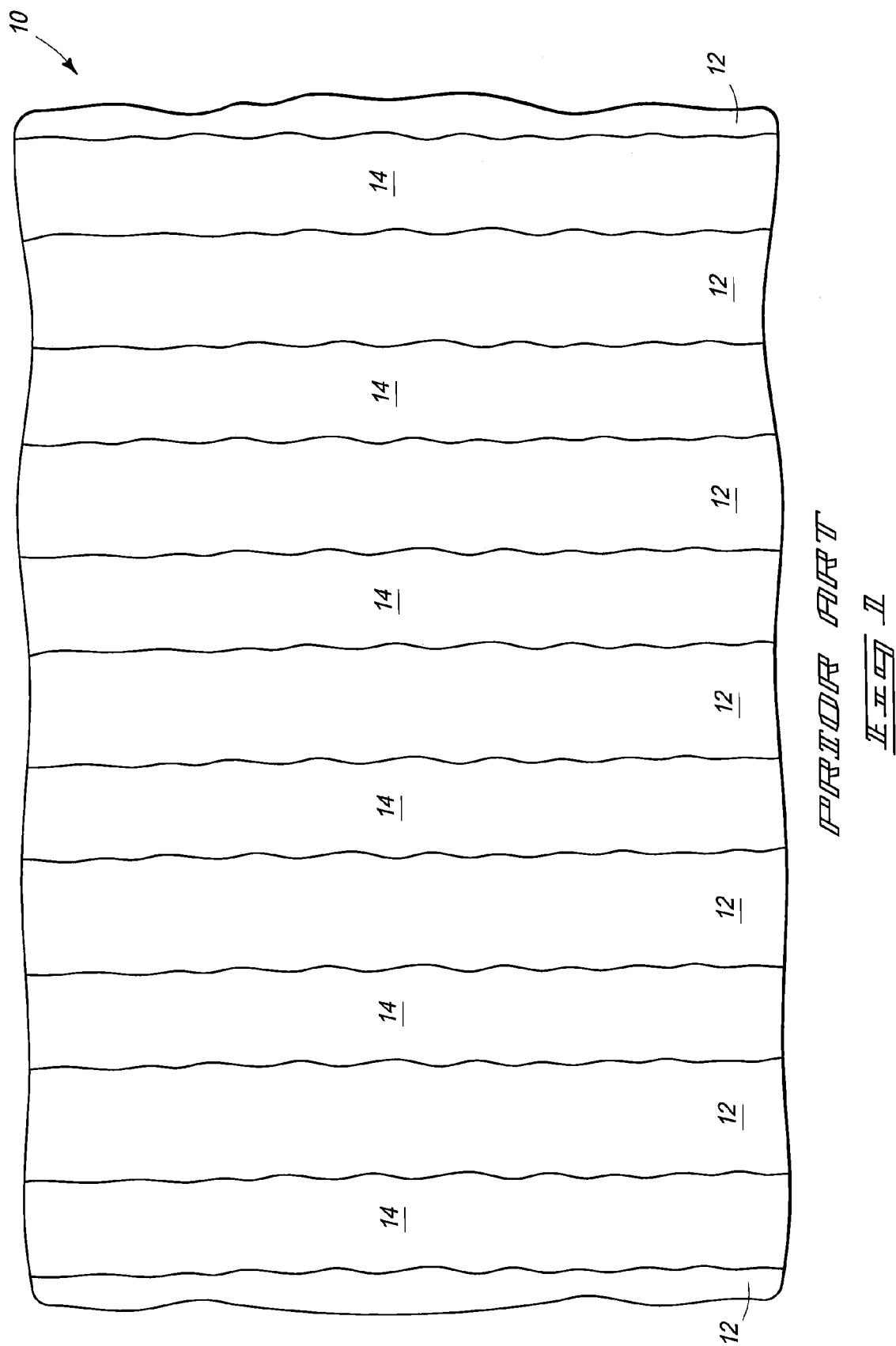
FIG. 1 is a diagrammatic top view of integrated circuitry illustrating a problem which motivated some embodiments of the invention.
Figure 2:
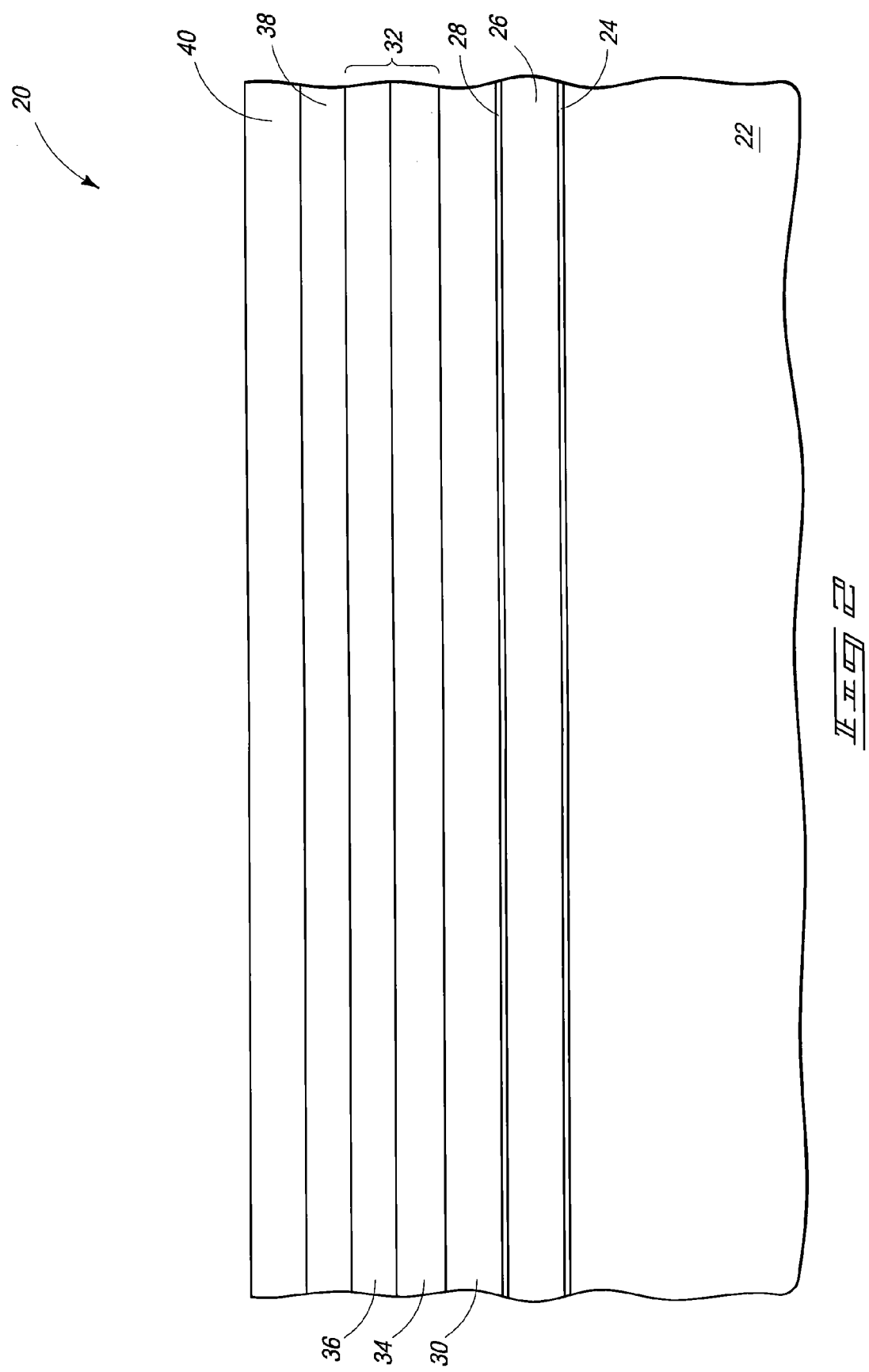
FIG. 2 is a diagrammatic sectional view of a semiconductor substrate in process in accordance with an embodiment of the invention.

The discussion initially proceeds with respect to FIGS. 2-7 in the fabrication of features which are a plurality of spaced charge storage transistor gate lines having respective minimum line widths of no greater than 30 nanometers, for example as may be used in flash or in other circuitry. Referring to FIG. 2, a substrate fragment 20 may be a semiconductive or other substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 20 comprises semiconductive material 22 which may comprise, consist essentially of, or consist of silicon. For example, such might comprise bulk monocrystalline silicon lightly background doped with p-type dopant. Semiconductive material 22 may comprise part of a semiconductor-on-insulator substrate or some other substrate whether existing or yet-to-be developed.

A tunnel dielectric 24 has been formed over semiconductive material 22. Such may comprise any suitable composition or combination of compositions, with undoped silicon dioxide being one example. A charge-retaining material 26 has been formed over tunnel dielectric 24. The charge-retaining material may comprise a floating gate (for example, polycrystalline silicon) or may comprise charge-trapping material (for example, silicon nitride). The charge-retaining material may be homogenous or non-homogenous, and as an example may comprise nanodots imbedded within dielectric material.

A blocking dielectric 28 has been formed over charge-retaining material 26. The blocking dielectric may comprise any suitable composition or combination of compositions. For example, such may comprise, consist essentially of, or consist of one or more of silicon nitride, silicon dioxide, or any of various high k dielectric materials having a dielectric constant greater than that of silicon dioxide. Control gate material 30 has been formed over blocking dielectric 28. Such is ultimately electrically conductive in the finished circuitry construction and may comprise, consist essentially of, or consist of one or more metals, metal-containing compositions, and conductively-doped semiconductive materials. All material underlying conductive layer 30 may, in one embodiment, be considered as a base.

A sacrificial hardmask material 32 has been formed over control gate material 30. In some embodiments, the sacrificial hardmask material comprises at least two layers of different composition as will be characterized below. Sacrificial hardmask material 32 in FIG. 2 is depicted as comprising two layers 34 and 36. More than two layers may be used. Further, FIG. 2 depicts an example embodiment where sacrificial hardmask material 32 is formed in direct physical touching contact with the conductive material 30. One or more additional layers may be provided intermediate hardmask material 32 and conductive material 30. Regardless, in the context of this document, use of "layer(s)" does not require blanketing or complete coverage of such over underlying material, and is synonymous in meaning with "material. A layer may be discontinuous or only partially received over underlying material.

An antireflective coating 38 and photoresist layer 40 have been formed outwardly of sacrificial hardmask material 32. Any suitable organic or inorganic antireflective coating may be used, or no antireflective coating used. Further, antireflective coating materials may be encompassed as part of the sacrificial hardmask material independent of providing any antireflective effect and/or independent of whether any additional antireflective materials are used outwardly of the sacrificial hardmask material. Photoresist 40 may comprise any suitable existing or yet-to-be developed positive or negative photoresist. Nevertheless, photolithography is not required.

Figure 3:
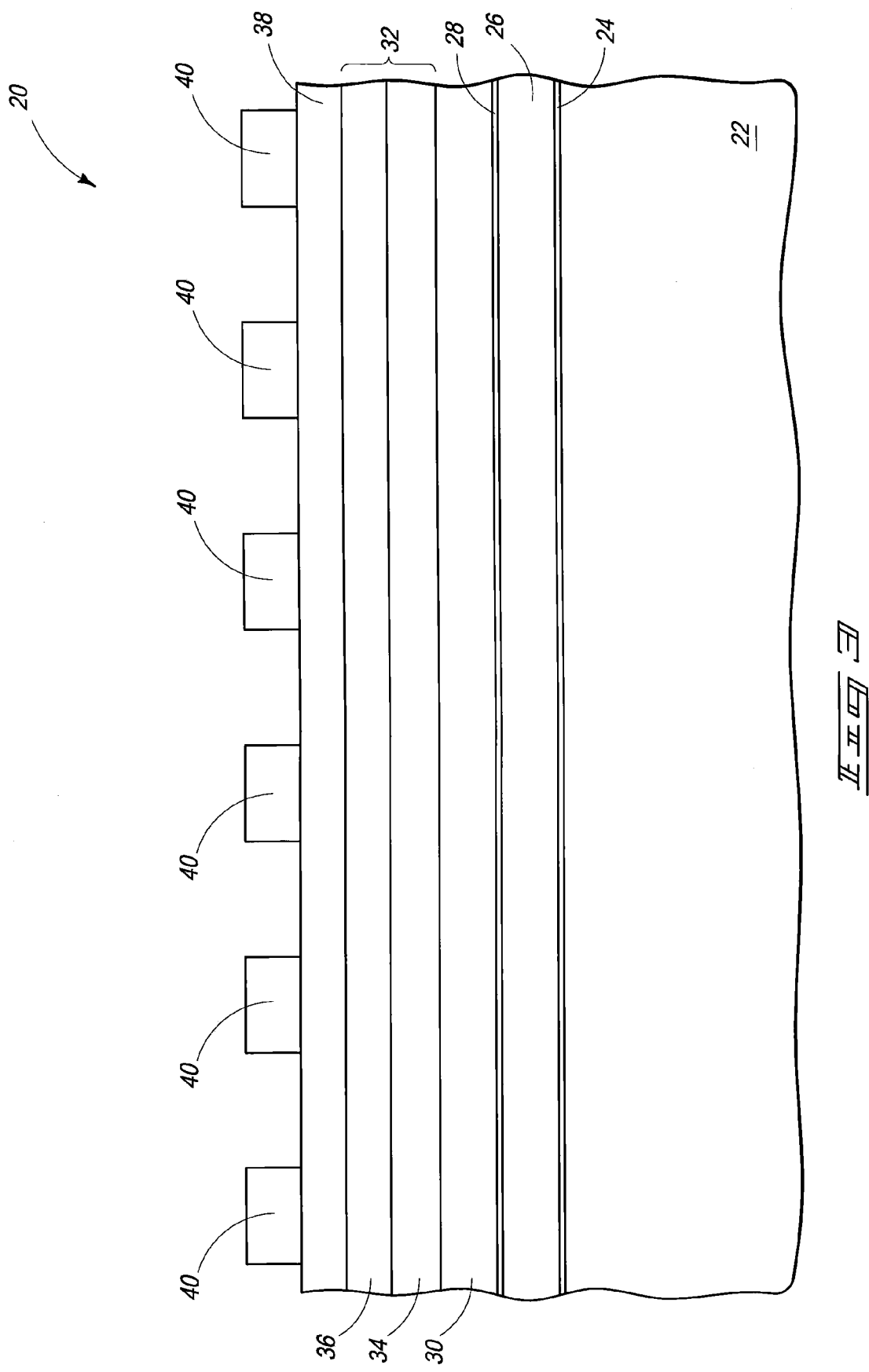
FIG. 3 is a view of the FIG. 2 substrate at a processing step subsequent to that shown by FIG. 2.

Referring to FIG. 3, photoresist 40 has been suitably patterned and developed to form the depicted mask line blocks that will be used to form an etch mask of the sacrificial hardmask material.

Figure 4:
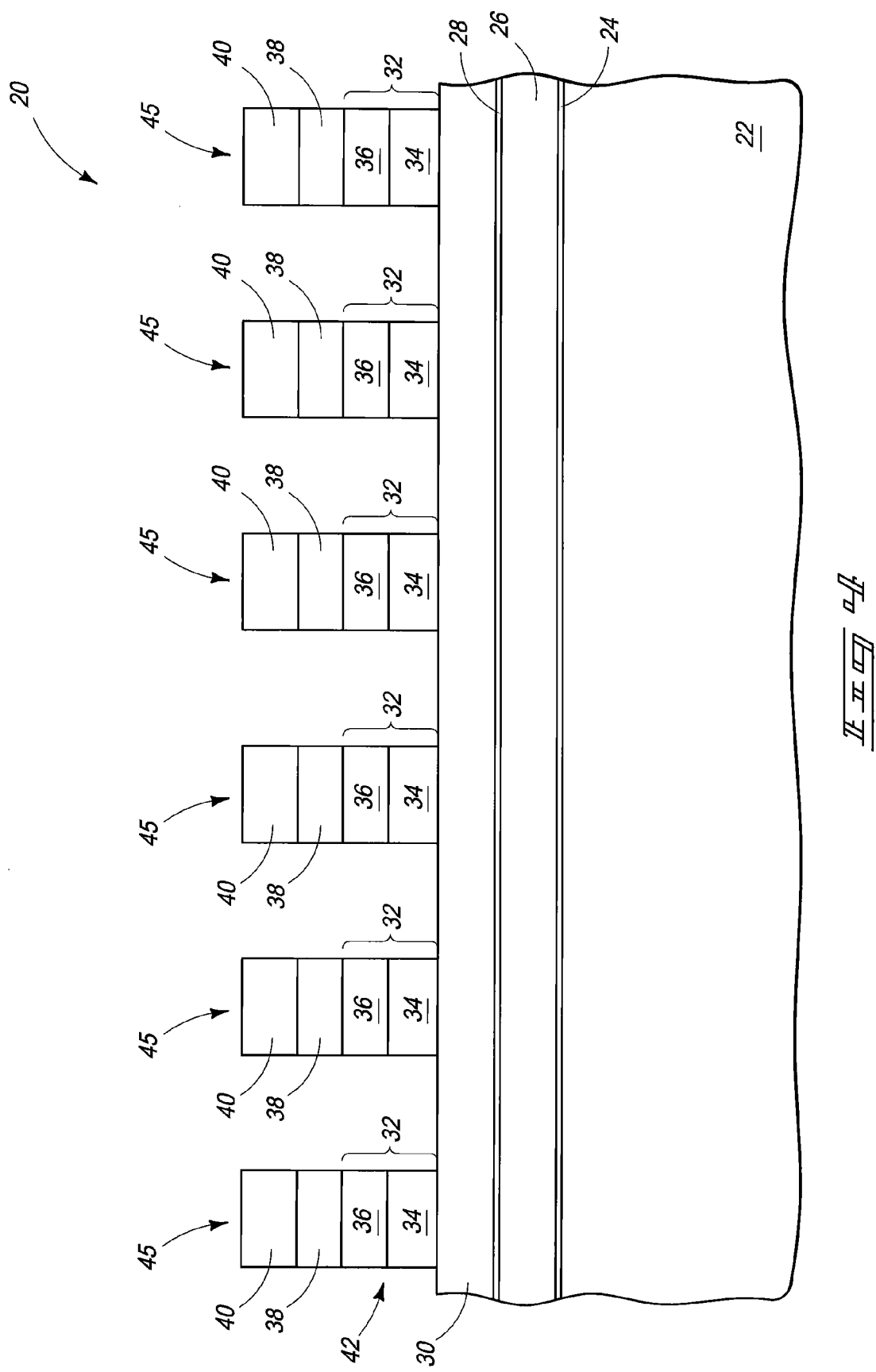
FIG. 4 is a view of the FIG. 3 substrate at a processing step subsequent to that shown by FIG. 3.

Referring to FIG. 4, portions of sacrificial hardmask material 32 have been removed to form a mask 42 comprising a plurality of spaced mask lines 45 that are received over control gate material 30 which, in one embodiment, have respective minimum widths of no greater than 30 nanometers. The respective widths of spaced mask lines 45 may be the same or different relative one another, and the spaced mask lines may be of the same or different shapes relative one another. Further, the width of individual mask lines 45 may not be constant. The FIG. 4 construction may be produced by using one or more suitable anisotropic etching chemistries. Sacrificial hardmask material 32 is depicted as having been etched completely through to underlying control gate material 30, although such is not required. Further, some, none, or all of photoresist 40 and antireflective coating 38 may be removed at this point or subsequently in the etching of material underlying sacrificial hardmask material 32.

Regardless, in one embodiment, spaced mask lines 45 comprise at least two layers of different composition, with two layers 34 and 36 being shown. One of the layers of the individual of the spaced mask lines 45 has a tensile intrinsic stress of at least 400.0 MPa, and the individual spaced mask lines each have a total tensile intrinsic stress greater than 0.0 MPa, during an etching of underlying material as will be described below. In the context of this document, tensile intrinsic stress is designated by positive numbers in mega-pascals, compressive intrinsic stress is designated by negative numbers in mega-pascals, and 0.0 Mpa designates no intrinsic stress. Further, greater compressive intrinsic stress is designated by larger negative numbers, for example a value of −700 MPa designates greater compressive intrinsic stress than −500 MPa. In one embodiment, the one layer has tensile intrinsic stress of at least 700 MPa, and in one embodiment at least 1 GPa, during the etching. In one embodiment, each of the individual features has a total tensile intrinsic stress during the etching of at least 100.0 MPa, and in one embodiment of at least 800.0 MPa.

Certain materials depending upon deposition technique and underlying substrate material may be deposited over a substrate to have tensile intrinsic stress as-deposited, compressive intrinsic stress as-deposited, or neutral/no intrinsic stress as-deposited. Also, the intrinsic stress of a deposited material may be modified after its deposition. For example, heating a substrate will tend to reduce degree of tensile of a tensile intrinsically stressed layer, and increase compressive intrinsic stress of a compressive intrinsically stressed layer. Accordingly, intrinsic stress of the at least two layers of different composition within the sacrificial hardmask material may or may not be the same during etching of underlying material as compared to the as-deposited state(s).

In one embodiment, another of the layers of hardmask material 32 of spaced mask lines 45 has compressive intrinsic stress during the etching of underlying material. Such may enable combining the usual high etch resistance of materials having compressive intrinsic stress with at least one additional layer having tensile intrinsic stress of at least 400.0 MPa to provide the individual features to each have a total tensile intrinsic stress which is positive at greater than 0.0 MPa. In one embodiment, the layer having compressive intrinsic stress is of at least −500 MPa, and in one embodiment of at least −1 GPa, during the etching. In one embodiment, a layer of the features has compressive intrinsic stress during the etching of at least −500 MPa, and the individual features each have total tensile intrinsic stress during the etching of at least 500.0 MPa, and in one embodiment of at least 800.0 MPa. Where a compressive intrinsic stress layer is used, such layer may be received elevationally inward or outward of the tensile intrinsic stress layer. Use of spaced mask lines which individually have a total tensile intrinsic stress immediately before and during etch of underlying material may in some embodiments reduce line waviness, for example than would otherwise occur under identical process conditions where the individual spaced mask lines each have total compressive intrinsic stress during the etching.

By way of examples only, a thickness range for the layer of tensile intrinsic stress of at least 400.0 MPa is from about 100 Angstroms to about 1,000 Angstroms, with in one embodiment being from about 200 Angstroms to about 500 Angstroms. Example thicknesses for a compressive intrinsic stress layer of spaced mask line features 45 is from about 100

Angstroms to about 1,200 Angstroms, with in one embodiment being from about 700 Angstroms to about 900 Angstroms.

Example materials which exhibit compressive intrinsic stress include amorphous carbon, for example amorphous graphitic carbon or tetrahedral amorphous carbon. Such may, for example, have respective compressive intrinsic stresses of 31 300 MPa and from −700 MPa to −10 GPa. Silicon dioxide deposited by low pressure chemical vapor deposition at a pressure of no greater than 1 Torr (LPCVD) or by plasma enhanced chemical vapor deposition (PECVD) of tetraethylorthosilicate (TEOS) at from 200° C. to 750° C. exhibits compressive intrinsic stress of from −10 MPa to −500 MPa. Fluorinated silicon glass deposited by PECVD at from 200° C. to 750° C. exhibits compressive intrinsic stress of from −5 MPa to −400 MPa. Thermally deposited silicon dioxide formed by furnace oxidation at from 750° C. to 1150° C. exhibits compressive intrinsic stress of from −350 MPa to −900 MPa.

Certain materials may exhibit tensile or compressive intrinsic stress depending upon method of deposition, underlying substrate, and processing of the substrate between time of deposition and time of use as a component in a hardmask during etch of material underlying the hardmask. Example materials that may be provided with tensile intrinsic stress of at least 400.0 MPa include nitrides (i.e., tungsten nitride, tantalum nitride, and/or silicon nitride), oxides (i.e., undoped silicon dioxide, fluorine doped silicon dioxide, and/or spin-on dielectrics which include silicon dioxide), silicides (i.e., cobalt silicide, titanium silicide, and/or nickel silicide), W, Ti, Cu, and Ni. For example, the one layer having tensile intrinsic stress may comprise one or more of such materials, or may consist essentially of, or consist of, one of such materials. Further, multiple layers having tensile intrinsic stress may be used.

In one embodiment, layer 34 of spaced mask lines 45 comprises a nitride, for example silicon nitride, having tensile intrinsic stress of at least 400.0 MPa and layer 36 comprises carbon having compressive intrinsic stress, yet with the individual spaced mask lines 45 each having a total intrinsic stress greater than 0.0 MPa. In such embodiment, the compositions of layers 34 and 36 may be reversed.

As examples, silicon dioxide deposited by chemical vapor deposition at a pressure of at least 3 Torr (CVD) at from 200° C. to 550° C. using $SiH_4$ as a precursor exhibits intrinsic stress of from −30 MPa to 63 MPa. Undoped silicon glass deposited by subatmospheric or thermal CVD at from 300° C. to 700° C. using TEOS or $SiH_4$ as a precursor exhibits intrinsic stress of from −300 MPa to 700 MPa. Spin On Dielectric (SOD) subjected to a post-deposition anneal at from 400° C. to 1000° C. exhibits intrinsic stress of from −300 MPa to 700 MPa, with such stress trending in the direction of compressive the higher and longer the temperature of the post-deposition anneal. Silicon nitride deposited by LPVD or PECVD at from 375° C. to 750° C. exhibits intrinsic stress of from −600 MPa to 1800 MPa. Silicon dioxide deposited by LPCVD at from 500° C. to 750° C. using $SiH_4$ as a precursor exhibits tensile intrinsic stress of from 210 MPa to 420 MPa. Tungsten nitride deposited by physical vapor deposition (PVD) or CVD at from 150° C. to 600° C. exhibits tensile intrinsic stress of from 500 MPa to 1200 MPa. Tantalum nitride deposited by PVD or CVD at from 150° C. to 600° C. exhibits tensile intrinsic stress of from 500 MPa to 1200 MPa. Tungsten deposited by PVD or CVD at from 150° C. to 600° C. exhibits tensile intrinsic stress of from 700 MPa to 1400 MPa. Titanium deposited by PVD or CVD at from 150° C. to 600° C. exhibits tensile intrinsic stress of from 350 MPa to 450 MPa. Cobalt silicide deposited by PVD or CVD at from 150° C. to 600° C. exhibits tensile intrinsic stress of from 700 MPa to 1400 MPa. Titanium silicide deposited by PVD, CVD, or atomic layer deposition (ALD) at from 150° C. to 600° C. exhibits tensile intrinsic stress of from 1500 MPa to 2100 MPa. Nickel silicide deposited by PVD, CVD, or ALD at from 150° C. to 600° C. exhibits tensile intrinsic stress of from 200 MPa to 600 MPa. Copper deposited by PVD or by chemical plating at from 30° C. to 600° C. exhibits tensile intrinsic stress of from 300 MPa to 600 MPa. Nickel deposited by PVD or by chemical plating at from 30° C. to 450° C. exhibits tensile intrinsic stress of from 300 MPa to 800 MPa.

Figure 5:
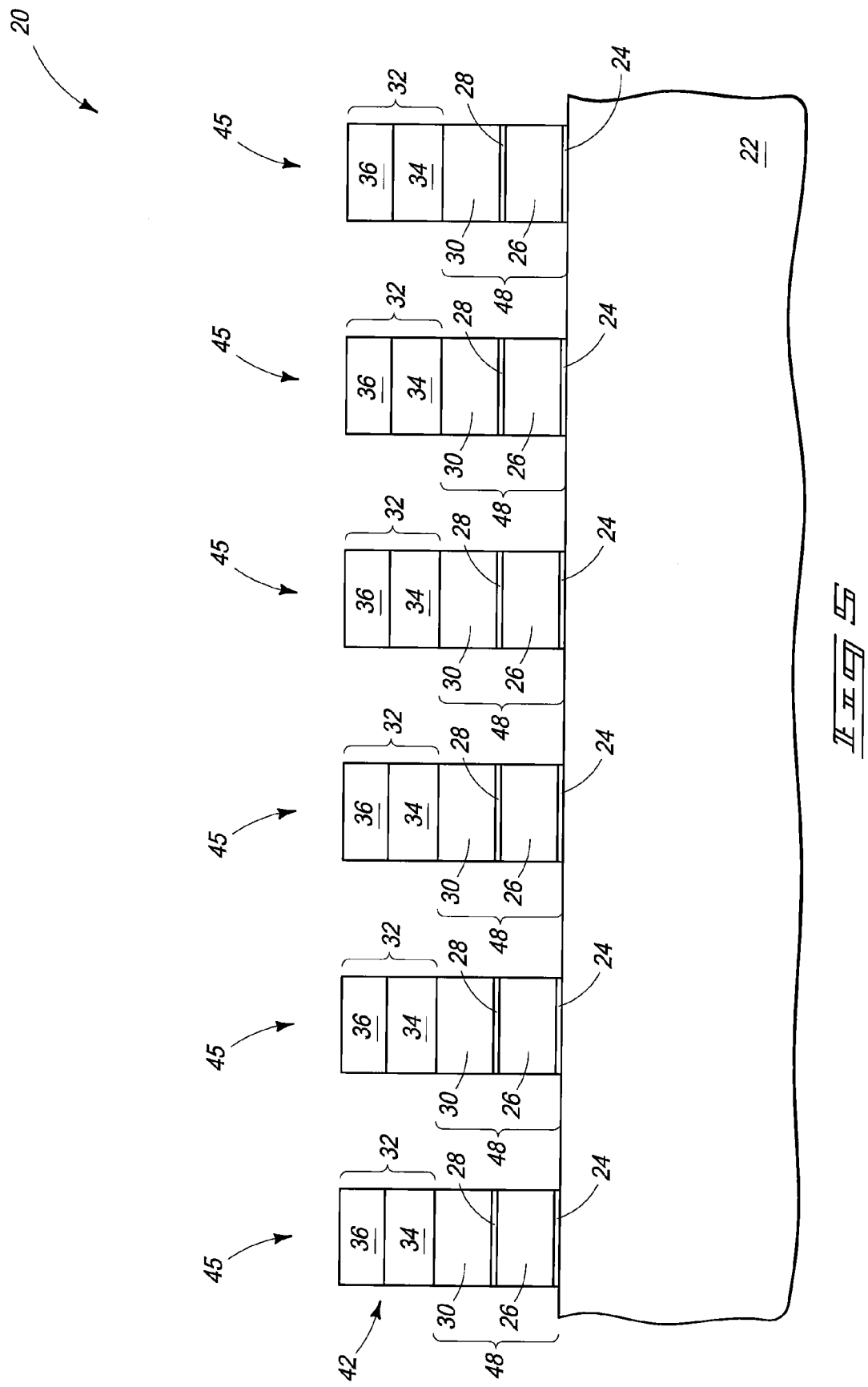
FIG. 5 is a view of the FIG. 4 substrate at a processing step subsequent to that shown by FIG. 4.
Figure 6:
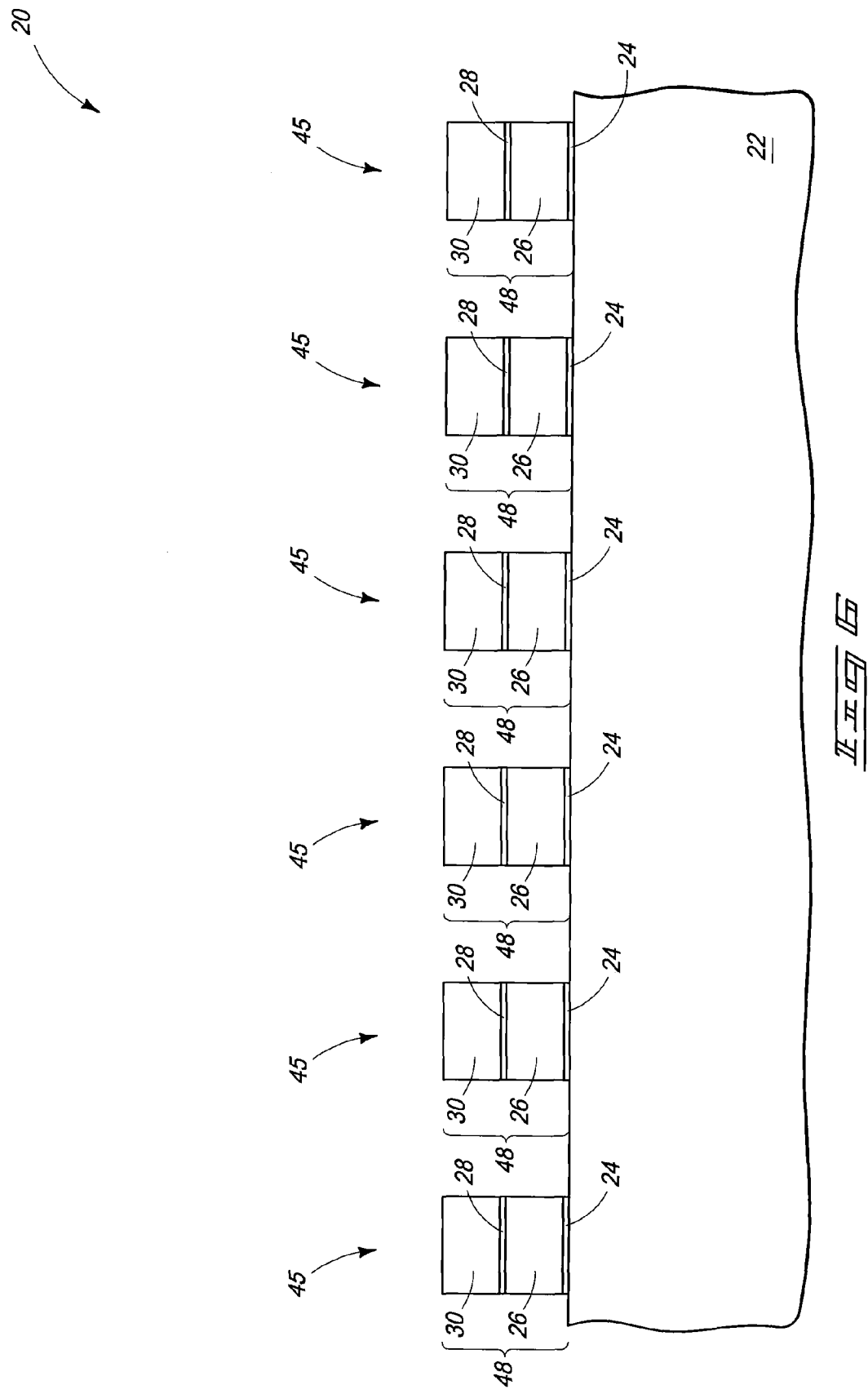
FIG. 6 is a view of the FIG. 5 substrate at a processing step subsequent to that shown by FIG. 5.
Figure 7:
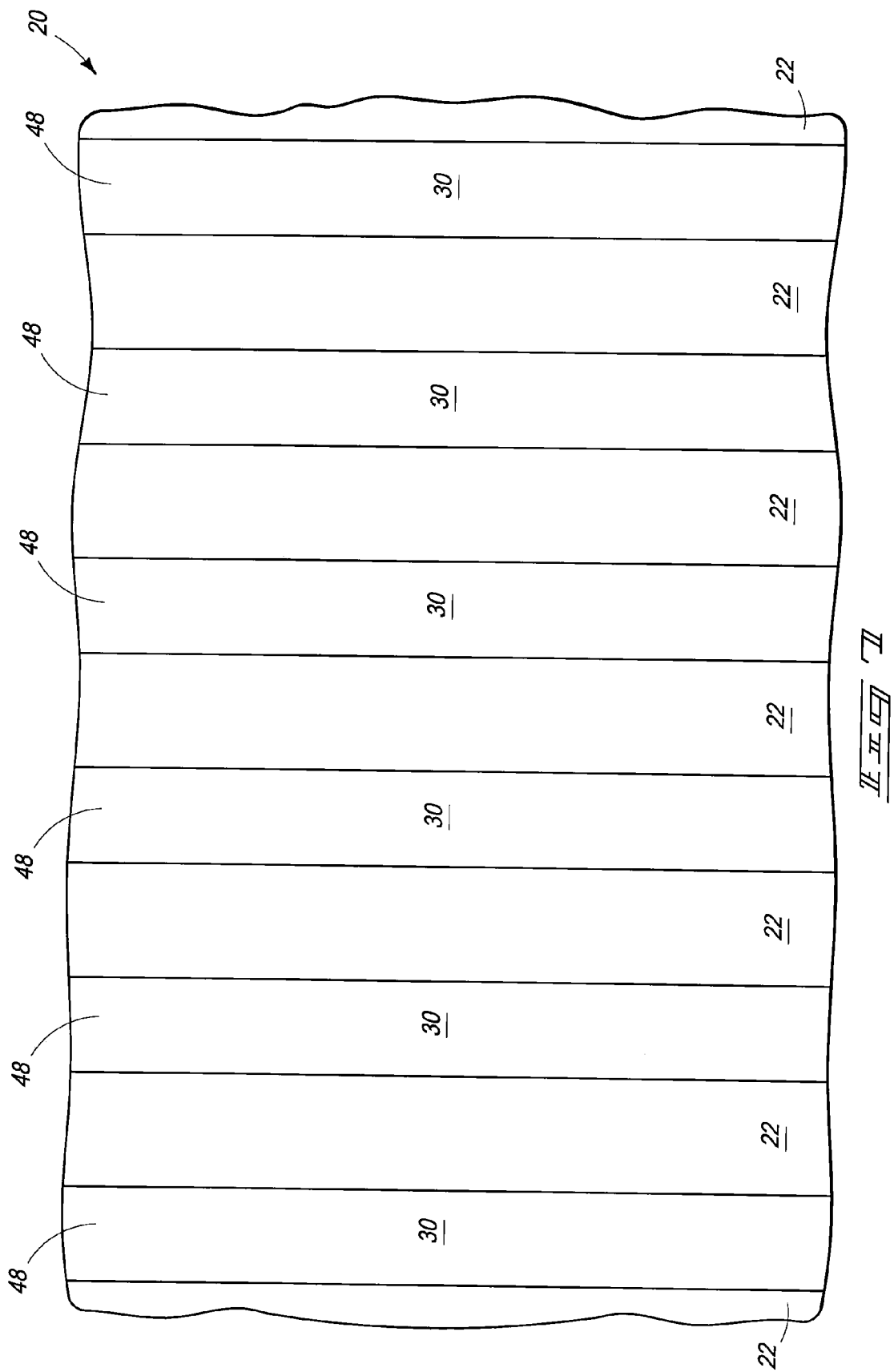
FIG. 7 is a top view of FIG. 6.

Referring to FIG. 5, mask 42 has been used while etching through control gate material 30, blocking dielectric 28, and charge-retaining material 26. Thereby, spaced features in the form of a plurality of spaced charge storage transistor gate lines 48 have been formed which, in one embodiment, have respective minimum widths of no greater than 30 nanometers. Tunnel dielectric 24 may also be etched though to semiconductive material 22, as shown. In one embodiment, the plurality of spaced features may have respective aspect ratios of at least 15:1. Some, none, or all of hardmask material 32 may be etched during the etch of underlying material to produce spaced charge storage transistor gate lines 48. FIG. 5 depicts an embodiment wherein portions of each of elevationally innermost layers 34, 36 of hardmask material 32 remain. FIGS. 6 and 7 depict subsequent removal of such portions, for example, by etching.

Figure 8:
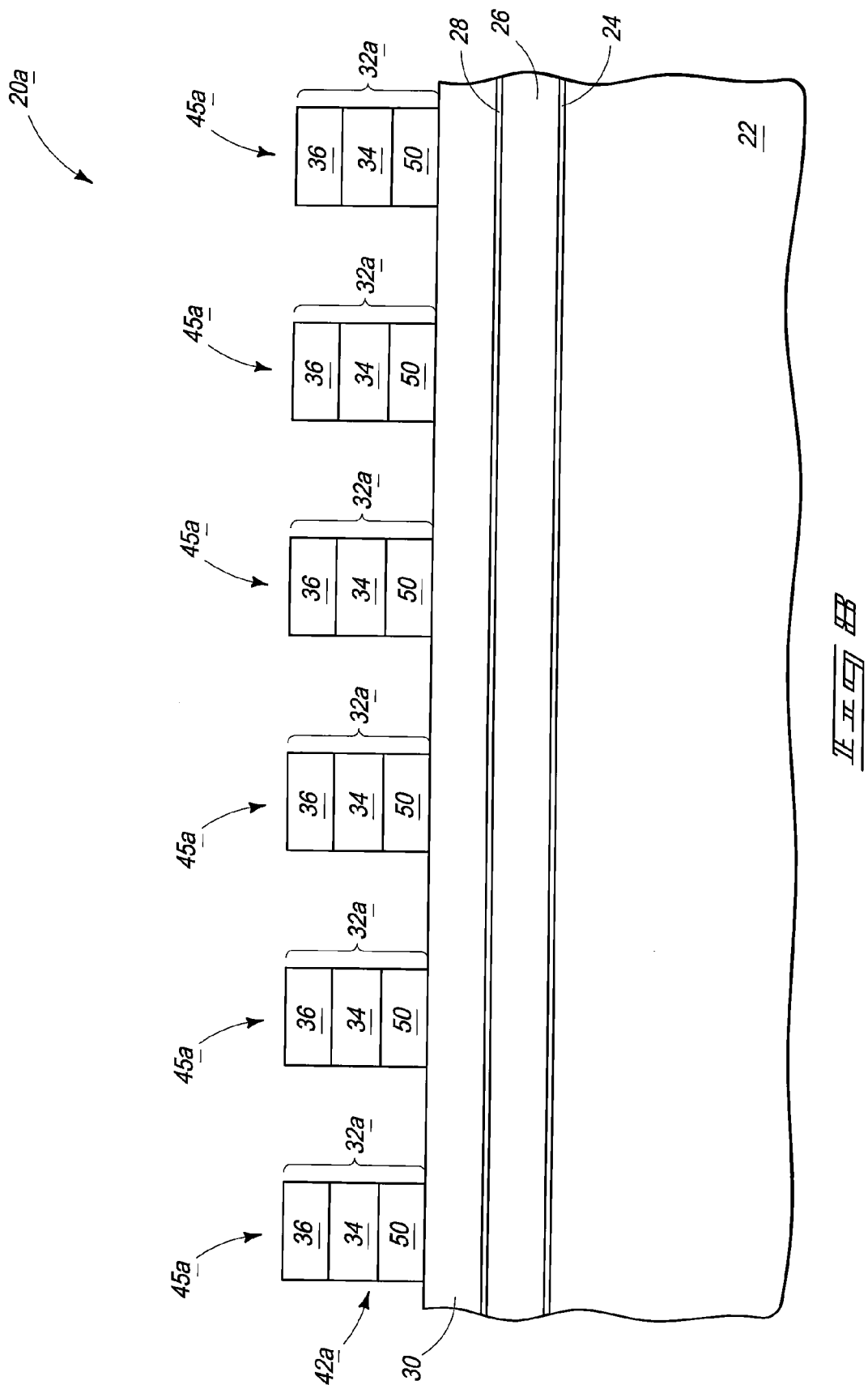
FIG. 8 is a diagrammatic sectional view of a semiconductor substrate in process in accordance with an embodiment of the invention.

An example alternate embodiment processing with respect to a substrate 20a is described with reference to FIGS. 8-10. Like numerals from the first described embodiment have been utilized where appropriate, with differences being indicated with suffix "a" or with different numerals. FIG. 8 depicts processing in sequence corresponding to that of FIG. 4 of the above-described embodiment in forming a mask 42a comprising spaced mask lines 45a. Such may be fabricated using existing or yet-to-be developed photolithographic or other technique. Hardmask material 32a of spaced mask lines 45a comprises an additional layer 50 received elevationally inward of layer 34. An example material is undoped silicon dioxide deposited by decomposition of tetraethylorthosilicate. Regardless, such layer may comprise compressive intrinsic stress during the subsequent etching or tensile intrinsic stress during the subsequent etching.

Figure 9:
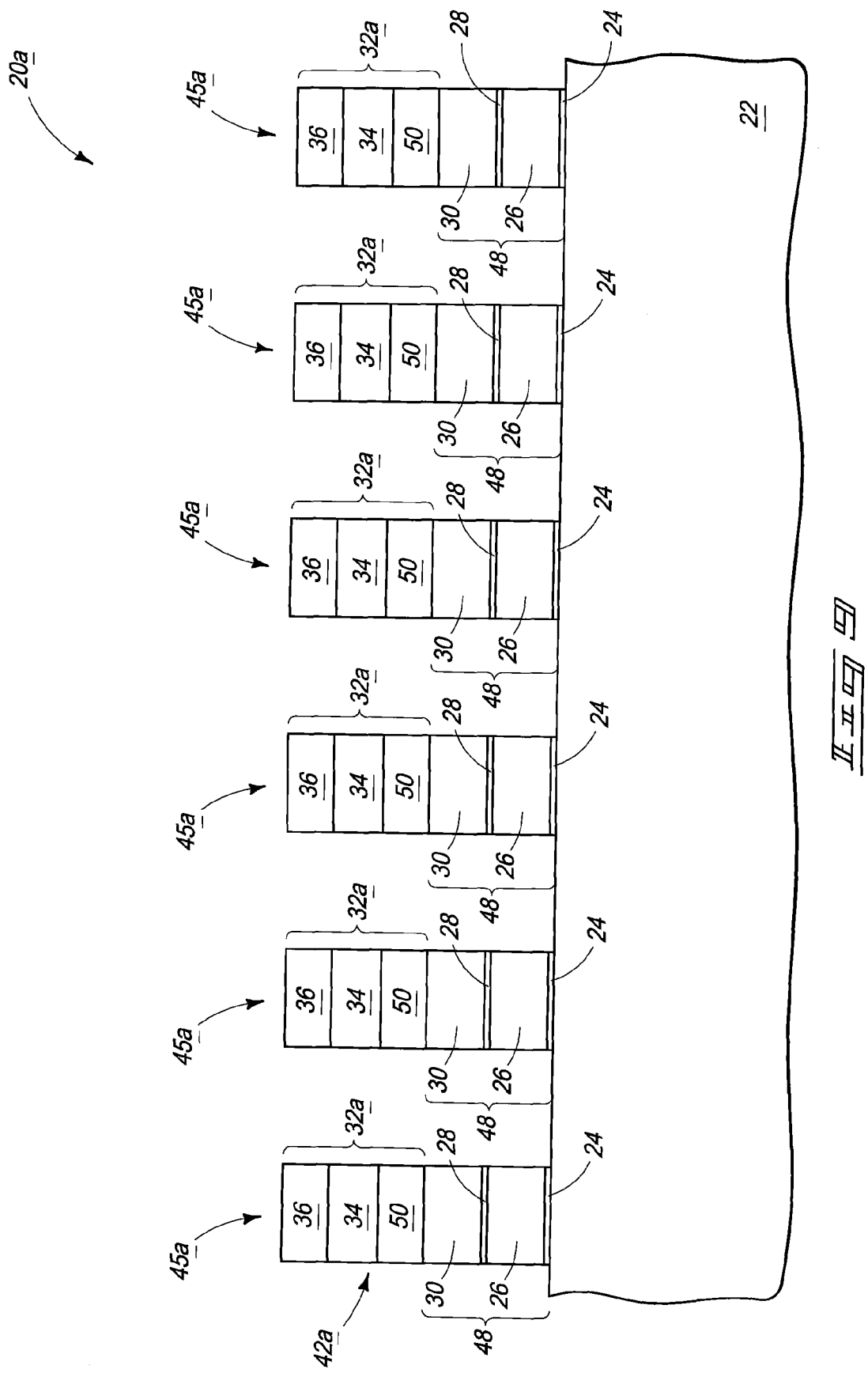
FIG. 9 is a view of the FIG. 8 substrate at a processing step subsequent to that shown by FIG. 8.
Figure 10:
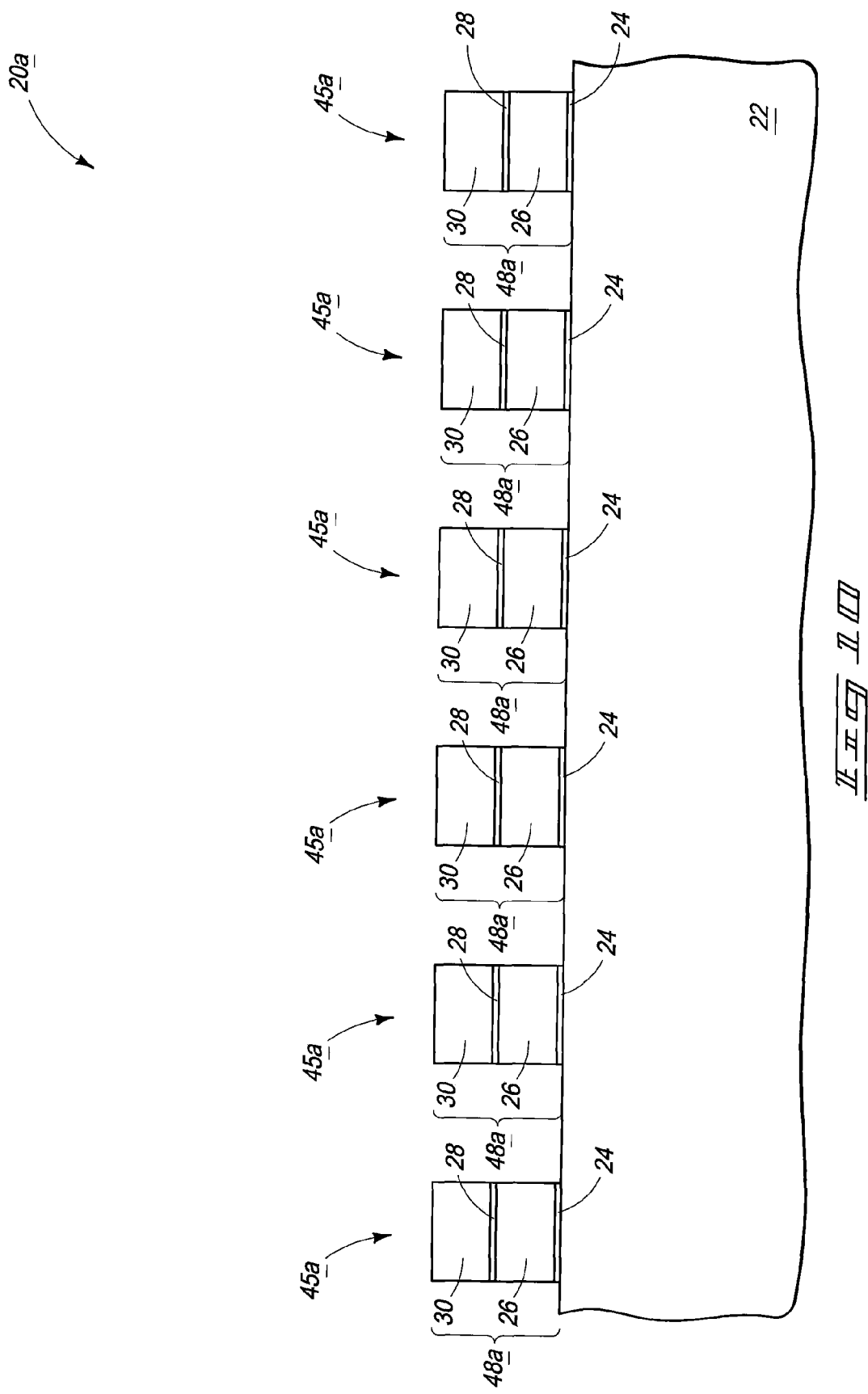
FIG. 10 is a view of the FIG. 9 substrate at a processing step subsequent to that shown by FIG. 9.

Referring to FIG. 9, mask 42a has been used while etching into the underlying material to form a plurality of spaced charge storage transistor gate lines 48. FIG. 9 depicts an embodiment wherein portions of each of layers 50, 34, and 36 remain at the conclusion of the etching of the underlying material. FIG. 10 depicts subsequent removal of such portions, for example by etching.

The above processing describes example techniques of forming a plurality of spaced features which in the above embodiment comprise a plurality of electrically conductive lines. Other features may be fabricated. Regardless, an example such embodiment includes forming sacrificial hardmask material over underlying material, wherein the sacrificial hardmask material comprises at least two layers of different composition. Portions of the sacrificial hardmask material are removed to form a mask over the underlying material. Individual features of the mask comprise the at least two layers of different composition. One of such layers of the individual features has a tensile intrinsic stress of at least 400.0 MPa, and the individual features each have a total tensile intrinsic stress greater than 0.0 MPa. Such mask is used while etching into the underlying material to form a plurality of spaced features which comprise such underlying material. Any of the above-described example techniques and materials may be used.

In one embodiment, a method of forming a plurality of spaced electrically conductive lines having respective minimum widths of no greater than 30 nanometers includes forming a plurality of spaced mask lines over electrically conductive material. Such mask lines have respective minimum widths of no greater than 30 nanometers, and individually have total tensile intrinsic stress immediately before and during etching of the conductive material using such spaced mask lines as a mask. The spaced mask lines may or may not have one layer having tensile intrinsic stress of at least 400.0 MPa. The spaced mask lines are used as an etch mask while conducting etching of the conductive material to form a plurality of spaced electrically conductive lines having respective minimum line widths of no greater than 30 nanometers.

An embodiment of the invention constitutes a method of reducing line waviness in etching electrically conductive material to form a plurality of spaced electrically conductive lines having respective minimum line widths of no greater than 30 nanometers. Such a method comprises using an etch mask having spaced mask lines which individually have a total tensile intrinsic stress immediate before and during such etching, and for example independent of the other attributes described above.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a plurality of spaced features, comprising:
    forming sacrificial hardmask material over underlying material, the sacrificial hardmask material comprising at least two layers of different composition;
    removing portions of the sacrificial hardmask material to form a mask over the underlying material, individual features of the mask comprising the at least two layers of different composition, one of the layers of the individual features having a tensile intrinsic stress of at least 400.0 MPa, the individual features having a total tensile intrinsic stress greater than 0.0 MPa; and
    using the mask having said individual features comprising the at least two layers while etching into the underlying material to form a plurality of spaced features comprising the underlying material.

2. The method of claim 1 wherein another of the layers has compressive intrinsic stress during the etching.

3. The method of claim 2 wherein the another layer has compressive intrinsic stress during the etching of at least −500 MPa.

4. The method of claim 3 wherein the another layer has compressive intrinsic stress during the etching of at least −1GPa.

5. The method of claim 2 wherein the one layer is elevationally inward of the another layer.

6. The method of claim 5 wherein the one layer has a thickness from about 100 Angstroms to about 1,000 Angstroms, and the another layer has a thickness from about 100 Angstroms to about 1,200 Angstroms.

7. The method of claim 6 wherein the one layer has a thickness from about 200 Angstroms to about 500 Angstroms, and the another layer has a thickness from about 700 Angstroms to about 900 Angstroms.

8. The method of claim 2 wherein the one layer is elevationally outward of the another layer.

9. The method of claim 1 wherein the one layer is one of two elevationally innermost of the at least two layers, portions of the two elevationally innermost layers remaining after completing said etching of the underlying material, and removing all of said portions after said etching.

10. The method of claim 1 wherein the hardmask material comprises at least three layers of different composition including the one layer, the one layer being one of three elevationally innermost of the at least three layers, portions of the three elevationally innermost of the at least three layers remaining after completing said etching of the underlying material, and removing all of said portions after said etching.

11. The method of claim 1 wherein the one layer has tensile intrinsic stress during the etching of at least 700 MPa.

12. The method of claim 11 wherein the one layer has tensile intrinsic stress during the etching of at least 1 GPa.

13. The method of claim 1 wherein the individual features have total tensile intrinsic stress during the etching of at least 100.0 MPa.

14. The method of claim 13 wherein the individual features have total tensile intrinsic stress during the etching of at least 800.0 MPa.

15. The method of claim 1 wherein another of the layers has compressive intrinsic stress during the etching of at least −500 MPa, and the individual features have total tensile intrinsic stress during the etching of at least 800.0 MPa.

16. The method of claim 1 wherein the one layer comprises at least one of a nitride, an oxide, a silicide, W, Ti, Cu, and Ni.

17. The method of claim 16 the one layer consists essentially of one of a nitride, an oxide, a silicide, W, Ti, Cu, or Ni.

18. The method of claim 17 wherein another of the layers has compressive intrinsic stress during the etching, the another layer consisting essentially of carbon.

19. The method of claim 1 wherein the plurality of spaced features have respective aspect ratios of at least 15:1.

20. A method of forming a plurality of spaced electrically conductive lines having respective minimum line widths of no greater than 30 nanometers, comprising:
    forming electrically conductive material over a base;
    forming sacrificial hardmask material over the conductive material, the sacrificial hardmask material comprising at least two layers of different composition;
    removing portions of the sacrificial hardmask material to form a mask comprising a plurality of spaced mask lines having respective minimum line widths of no greater than 30 nanometers over the conductive material, the spaced mask lines comprising the at least two layers of different composition, one of the layers of individual of the spaced mask lines having a tensile intrinsic stress of at least 400.0 MPa, the individual spaced mask lines having a total tensile intrinsic stress greater than 0.0 MPa; and
    using the mask having the at least two layers while etching into the conductive material to form a plurality of spaced electrically conductive lines having respective minimum line widths of no greater than 30 nanometers.

21. The method of claim 20 wherein another of the layers has compressive intrinsic stress during the etching of at least −500 MPa, and the individual spaced mask lines have total tensile intrinsic stress during the etching which is at least 500.0 MPa.

22. The method of claim 21 wherein the another layer comprises carbon and the one layer comprises a nitride.

23. The method of claim 22 wherein the one layer is elevationally inward of the another layer.

24. The method of claim 23 wherein the at least two layers comprise an additional layer elevationally inward of the one layer.

25. The method of claim 24 wherein the additional layer has compressive intrinsic stress during the etching.

26. The method of claim 24 wherein the additional layer comprises undoped silicon dioxide.

27. The method of claim 26 wherein the additional layer has compressive intrinsic stress during the etching.

28. A method of forming a plurality of spaced charge storage transistor gate lines having respective minimum line widths of no greater than 30 nanometers, comprising:
    forming tunnel dielectric over semiconductive material;
    forming charge-retaining material over the tunnel dielectric;
    forming blocking dielectric over the charge-retaining material;
    forming control gate material over the blocking dielectric;
    forming sacrificial hardmask material over the control gate material, the sacrificial hardmask material comprising at least two layers of different composition;
    removing portions of the sacrificial hardmask material to form a mask comprising a plurality of spaced mask lines having respective minimum widths of no greater than 30 nanometers over the control gate material, the spaced mask lines comprising the at least two layers of different composition, one of the layers of individual of the spaced mask lines having a tensile intrinsic stress of at least 400.0 MPa, the individual spaced mask lines having a total tensile intrinsic stress greater than 0.0 MPa; and
    using the mask having the at least two layers while etching through the control gate material, the blocking dielectric, and the charge-retaining material to form a plurality of spaced charge storage transistor gate lines having respective minimum widths of no greater than 30 nanometers.

* * * * *